(12) United States Patent
Schoormans et al.

(10) Patent No.: US 7,684,011 B2
(45) Date of Patent: Mar. 23, 2010

(54) CALIBRATION METHOD FOR A LITHOGRAPHIC APPARATUS

(75) Inventors: Carolus Johannes Catharina Schoormans, Hooge Mierde (NL); Alex Van Zon, Waalre (NL); Johannes Mathias Theodorus Antonius Adriaens, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 571 days.

(21) Appl. No.: 11/713,086

(22) Filed: Mar. 2, 2007

(65) Prior Publication Data
US 2008/0212055 A1    Sep. 4, 2008

(51) Int. Cl.
G03B 27/42    (2006.01)
G03B 27/58    (2006.01)
G03B 27/32    (2006.01)

(52) U.S. Cl. .............................. 355/53; 355/72; 355/77
(58) Field of Classification Search .................... 355/53, 355/72, 77; 430/311; 250/492.2; 356/399, 356/400, 401
See application file for complete search history.

(56) References Cited

U.S. PATENT DOCUMENTS 5,144,363 A * 9/1992 Wittekoek et al. ............. 355/53
7,259,828 B2 * 8/2007 Tolsma et al. .................. 355/40
2004/0130690 A1 * 7/2004 Koren et al. ................... 355/53
2004/0268289 A1 * 12/2004 Sandstrom et al. ............ 716/19
2006/0023214 A1 * 2/2006 Lof et al. ...................... 356/401
2006/0114437 A1 * 6/2006 Akhssay et al. ............... 355/55

* cited by examiner

Primary Examiner—Alan A Mathews
(74) Attorney, Agent, or Firm—Pillsbury Winthrop Shaw Pittman LLP

(57) ABSTRACT

Method to calibrate a substrate table position in a lithographic apparatus includes providing a substrate on the substrate table with a two dimensional arrangement of patterns; positioning the substrate table with a positioning system; measuring positions of the substrate table in at least two dimensions with a position measurement system; reading out the arrangement of patterns as a function of the measured positions of the substrate table with a pattern read out system to obtain pattern read out results; deriving position errors as a function of the measured positions of the substrate table compared with the pattern read out results; calibrating the positioning system using the position errors, the calibrating including determining drift influences of the positioning system, correcting the position errors as a function of the corresponding two dimensional position of the substrate table with the determined drift influences, and calibrating the positioning system with the corrected position errors.

31 Claims, 7 Drawing Sheets

CALIBRATION METHOD FOR A LITHOGRAPHIC APPARATUS

BACKGROUND

1. Field of the Invention

The present invention relates to a calibration method to calibrate a lithographic apparatus. Further, the invention relates to a lithographic apparatus including a control system to calibrate the apparatus, as well as to a computer product to perform a calibration method.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A lithographic apparatus includes a substrate table. A position of the substrate table is measured by a measurement system including position sensors. The position sensors may include, e.g., an interferometer and/or an encoder. The interferometer is a type of optical measurement device which measures a distance towards a reference, commonly a mirror or other reflecting surface. The encoder is a type of optical measurement device which measures a position of a reference by detecting an interaction of an optical beam with a pattern on the reference, the pattern including a grid, grating, etc. Depending on a position of the reference, a different reflection, diffraction, etc. will occur, which is detected and thus measured, thereby providing position information regarding the reference.

In an existing design of the lithographic apparatus, the substrate table includes reflecting sides. The interferometers use these reflecting sides as mirrors by directing a measurement beam thereto. A plurality of the interferometers is used directed at different sides of the substrate table. Preferably, at least two interferometers are directed to a same reflecting side of the substrate table, thereby providing information as to a length of an optical part between the interferometer and the reflecting side of the substrate table. Thereby, a position of the substrate table may be measured in a plane substantially parallel to the surface of the substrate held by the substrate table. This plane is commonly indicated as the X, Y plane, while the dimension perpendicular thereto is referred to as the Z dimension. By such a combination of interferometers, a position of the substrate table may be provided in X and Y direction as well as in a rotation with respect to the Z axis.

However, the reflecting sides have imperfections. In particular, they may show irregularities in flatness on the surface thereof, which irregularities are position dependent and result in an error in the measurement of the position of the substrate table. This error is also dependent on the position at which the beam of the interferometer is reflected by the reflective side. For example, an error of the interferometer to measure a position of the substrate table in X direction is dependant on a position in Y direction of the substrate table, and vice versa. An error in a measurement of a rotation of the substrate table with respect to the Z axis is dependant on a position of the substrate table in Y direction, assuming that the rotation is measured by directing two or more interferometers towards a side of the substrate table which is parallel to the Y direction.

In order to compensate for these errors, it is known to perform a calibration process, in which—a pattern is repeatedly irradiated onto the surface of the substrate, the substrate being displaced between successive irradiations thereby irradiating the patterns next to each other, or partly overlapping, to form a single dimensional arrangement of patterns on the surface of the substrate, the arrangement extending preferably in X or Y direction. The patterns are read out and incremental position deviations are derived from reading out neighboring (e.g. overlapping) patterns. Therefrom, a position error is derived, which may be used to calibrate the position of the substrate table in the dimension in question.

It is noted that this calibration does not provide a separate calibration for the measurement system, but provides a calibration of the positioning system as a whole which provides for the positioning of the substrate table, the measurement system forming part of that positioning system.

In recent designs, requirements as to the accuracy of the position measurement system of the substrate table are increased, and use has been made of a two dimensional grating provided over the substrate table. The substrate table is provided with a plurality of sensors, which provide position information by directing appropriate measurement beams towards the grid or grating. The measurement sensors may, e.g., include interferometers, encoders, or any combination thereof, depending on the position information to be obtained from that particular sensor. In these configurations, each of the sensors is prone to an error, which is dependant on the position of the substrate table in both X and Y directions. This is caused by the fact that irregularities of these grating plates also result in local position errors. From the signals provided by the individual sensors, a measured position of the substrate table in each of these degrees of freedom thus also shows a position dependent error (deviation from the actual position of the table).

Consequently, here also a calibration process is desired to compensate for the effects of imperfections in the measurement system.

SUMMARY

It is desirable to provide an improved calibration for a lithographic apparatus.

According to an embodiment of the invention, there is provided a calibration method including providing a substrate on the substrate table, the substrate including a two dimensional arrangement of patterns on the surface thereof, positioning the substrate table with a positioning system; measuring positions of the substrate table in at least the two dimensions with a position measurement system that forms part of the positioning system; reading out the arrangement of patterns on the substrate as a function of the measured positions of the substrate table with a pattern read out system that forms part of the positioning system to obtain pattern read out results; deriving position errors as a function of the measured positions of the substrate table compared with the pattern read out results; calibrating the positioning system using the position errors, wherein drift influences of the positioning system are determined, which determined drift influences are used to correct the position errors as a function of the corresponding two dimensional position of the substrate table, and wherein the corrected position errors are used for the calibrating of the positioning system.

In an embodiment of the invention, there is provided a lithographic apparatus including an illumination system configured to condition a radiation beam; a support constructed to support a patterning device, the patterning device configured to impart the radiation beam with a pattern in its cross-section to form a patterned radiation beam; a substrate table constructed to hold a substrate; a projection system configured to project the patterned radiation beam onto a target portion of the substrate, a positioning system configured to position the substrate table, including a measurement system configured to measure positions of the substrate table in at least two dimensions, and a pattern read out system configured to read out a two dimensional arrangement of patterns on a substrate held on the substrate table as a function of the measured positions of the substrate table to obtain pattern read out results; a control system configured to derive position errors as a function of the measured positions of the substrate table compared with the pattern read out results, and to calibrate the positioning system using the position errors. The control system is further configured to determine drift influences of the positioning system, to use the determined drift influences to correct the position errors as a function of the corresponding two dimensional position of the substrate table, and to use the corrected position errors to calibrate the positioning system.

In an embodiment of the invention, there is provided a software program or computer product including machine readable instructions configured to, when loaded into a control system of a lithographic apparatus, have the lithographic apparatus perform a calibration method for calibrating a position of a substrate table, the method including providing a substrate on the substrate table, the substrate including a two dimensional arrangement of patterns on a surface thereof; positioning the substrate table with a positioning system; measuring positions of the substrate table in at least two dimensions with a position measurement system that forms part of the positioning system; reading out the arrangement of patterns on the substrate as a function of the measured positions of the substrate table with a pattern read out system that forms part of the positioning system to obtain pattern read out results; deriving position errors as a function of the measured positions of the substrate table compared with the pattern read out results; and calibrating the positioning system using the position errors, the calibrating including determining drift influences of the positioning system, which determined drift influences are used to correct the position errors as a function of the corresponding two dimensional positions of the substrate table, and wherein the corrected position errors are used to calibrate of the positioning system.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
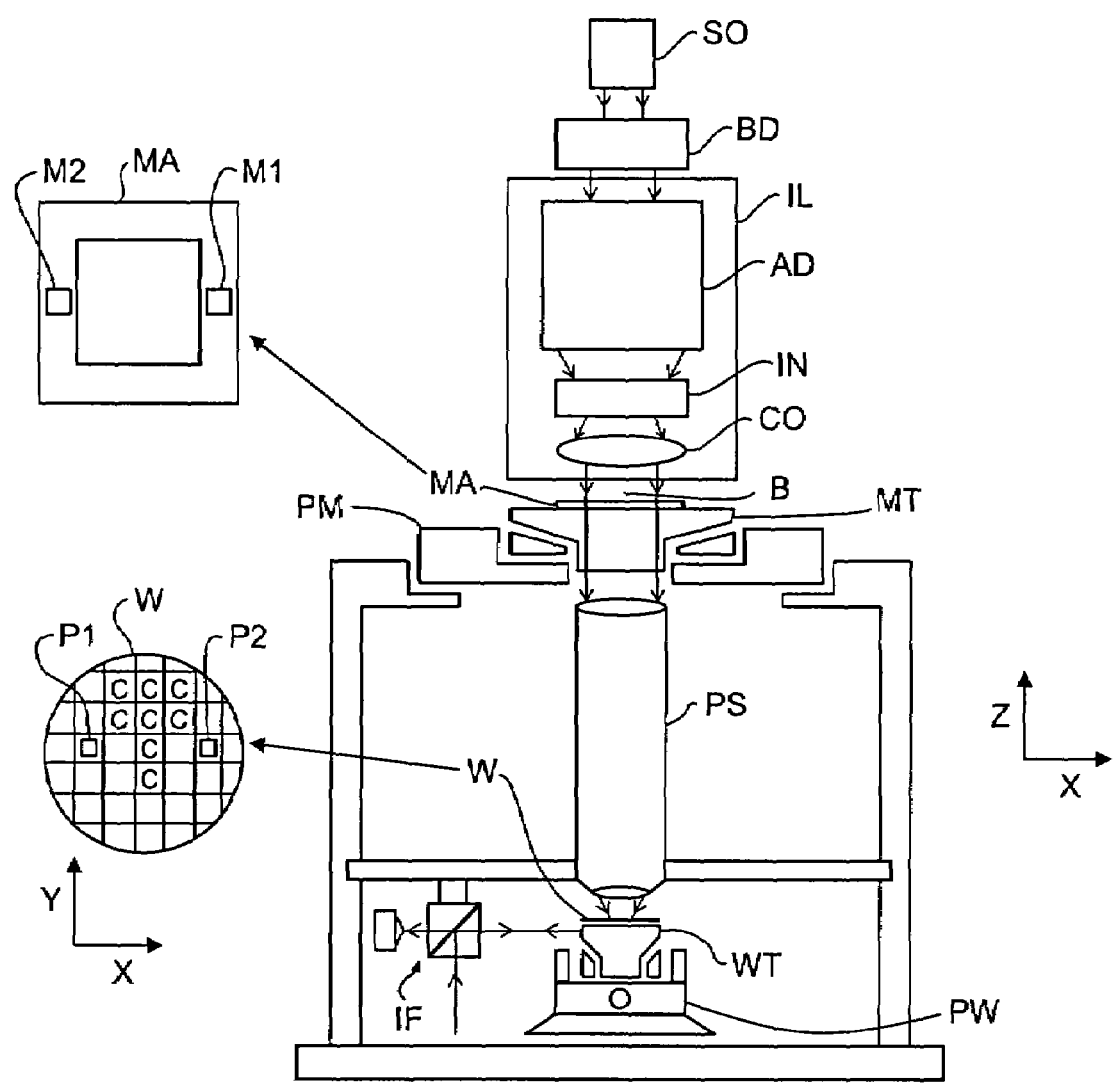
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device (e.g. mask). It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features.

Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the patterning device MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the support structure (e.g. mask table) MT or "patterning device support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT or "patterning device support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the support structure (e.g. mask table) MT or "patterning device support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In order to be able to improve the performance of the lithographic apparatus, a calibration process is performed in order to calibrate the positioning system of the substrate table WT thereof. The calibration method includes providing on the substrate table WT a substrate W with a two dimensional arrangement of patterns on the surface thereof. Subsequently, the substrate table WT is positioned with a positioning system, and positions of the substrate table WT are measured in at least the two dimensions with a position measurement system which may be part of the positioning system. Then, the arrangement of patterns on the substrate W is read out as a function of the measured positions of the substrate table WT with a pattern read out system, for example a lens coordinate system. The pattern read out system may be part of the positioning system. By comparing the measured positions of the substrate table WT with the pattern read out results, position errors are derived, which can be used to calibrate the positioning system.

However, such a calibration process may be time consuming because of the large amount of local position errors which have to be calibrated. Therefore, it is desirable that the apparatus remains stable. Furthermore, high demands on the accuracy of the calibration lead to a large number of exposures and measurements. This also increases the duration of the calibration. Because of the long duration, which might last up to 14 hours or more, drift inside the lithographic apparatus may occur. For example, temperature changes may have an influence on the substrate W, the substrate table WT, the positioning system of the substrate table WT, etc. and thus disturb the calibration process.

Figure 2:
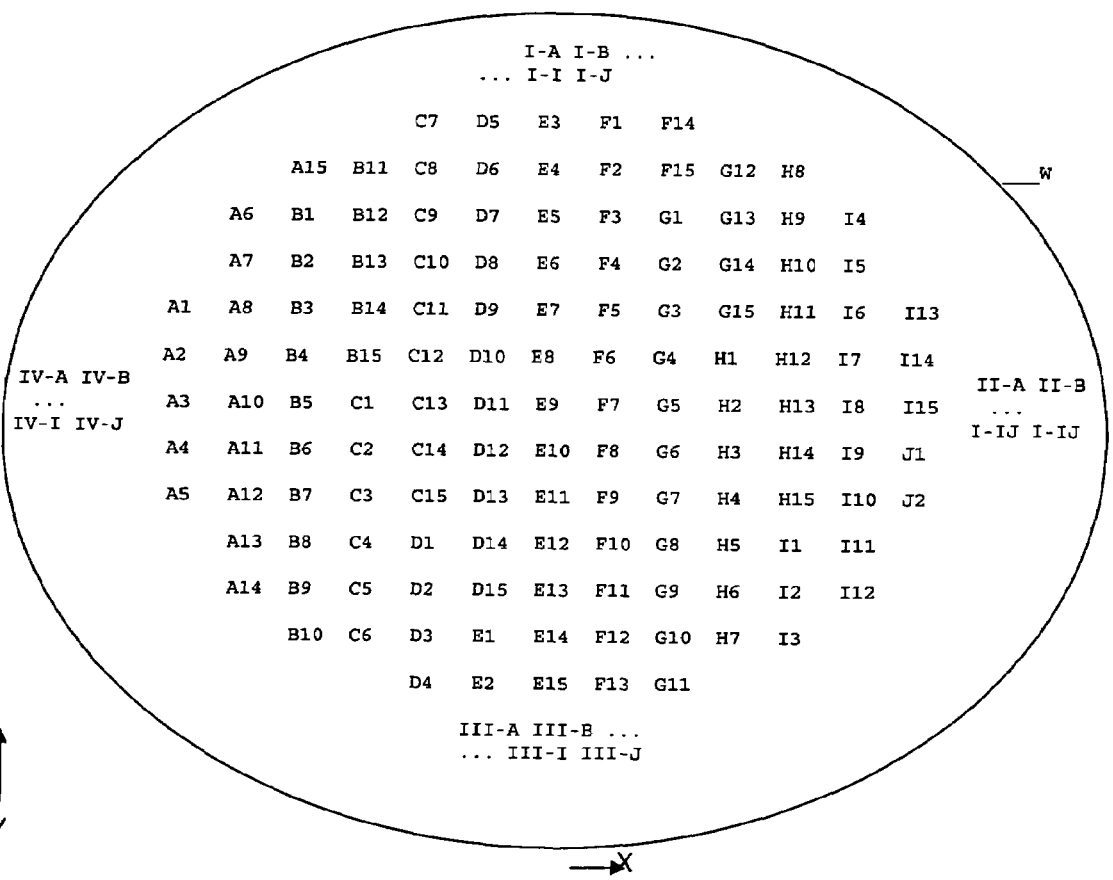
FIG. 2 depicts a top view of an arrangement of patterns with sets of reference patterns exposed in between according to an embodiment of the invention.

According to an embodiment of the invention, these drift influences, which occur, during the exposure and/or reading out of the patterns as part of the calibration process are taken into account, and are used to correct the position errors in time as a function of the corresponding two dimensional position of the substrate table. For example, FIG. 2 depicts an arrangement of patterns exposed in a particular order during the calibration process onto a surface of the substrate W. The patterns are repeated in X direction as well as in Y direction. The substrate table is displaced between successive irradiations of the patterns, to create a two dimensional arrangement of patterns. Each of the patterns is indicated with a successive reference sign A1, A2, . . . , J14, J15. In order to be able to correct for the abovementioned drift influences, four sets of reference patterns I-A, I-B, . . . , IV-I, IV-J are exposed in corresponding dedicated areas I, II, III, IV at positions close to each other. The dedicated areas are divided around the circumference of the substrate W. The respective reference patterns I-A, I-B, IV-I, IV-J are exposed at different moments in time in between the exposure of the other patterns A1, A2, . . . , J14, J15. For example, the order of the exposures may be:

I-A, II-A, III-A, IV-A
A1, A2, . . . , A15
I-B, II-B, III-B, IV-B
B1, B2, . . . , B15
. . .
I-J, II-J, III-J, IV-J
J1, J2, . . . , J15

Each set of reference patterns in a particular dedicated area I, II, III, IV can beneficially be used to determine the drift influences for that specific area. By measuring the positions of the substrate table WT and comparing them with the pattern read out results of the sets of reference patterns, the drift influences thereof can be derived, and can be used to correct position errors which are measured for the rest of the patterns.

Figure 3:
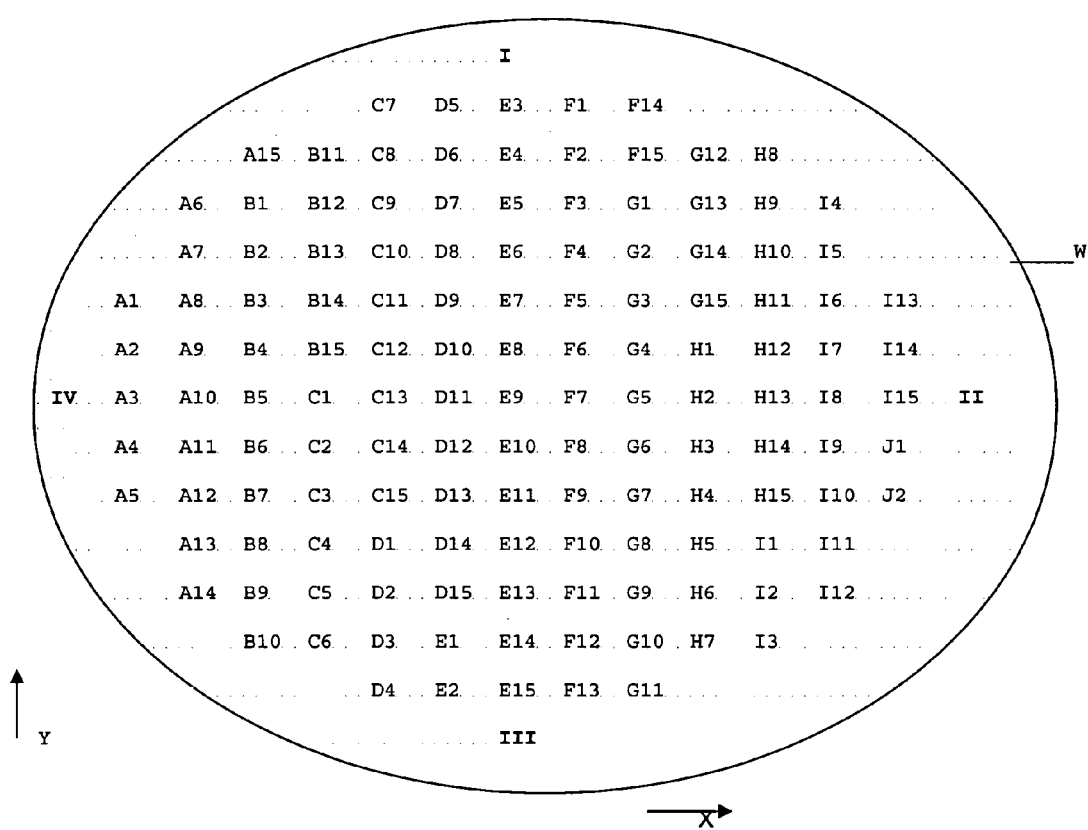
FIG. 3 depicts a top view of an arrangement of patterns with reference patterns read out in between according to an embodiment of the invention.

In addition thereto or as an alternative, a similar drift determination and correction may be performed by reading out a two dimensional arrangement of patterns in a particular order. FIG. 3 shows an example thereof. Again, each of the patterns is indicated with a successive reference sign A1, A2, . . . , J14, J15. In order to be able to correct for the abovementioned drift influences, four so-called reference patterns I, II, III, IV are repeatedly read out. The reference patterns are divided around the circumference of the substrate W, and are read out at different moments in time in between the reading out of the other patterns A1, A2, . . . , J14, J15. For example, the order of the reading out may be:

I, II, III, IV
A1, A2, . . . , A15
I, II, III, IV
B1, B2, . . . , B15
. . .
I, II, III, IV
J1, J2, . . . , J15

By measuring the positions of the substrate table WT each time the reference patterns are read out, the drift influences thereof can be derived, and can be used to correct position errors which are measured for the rest of the patterns.

Figure 4:
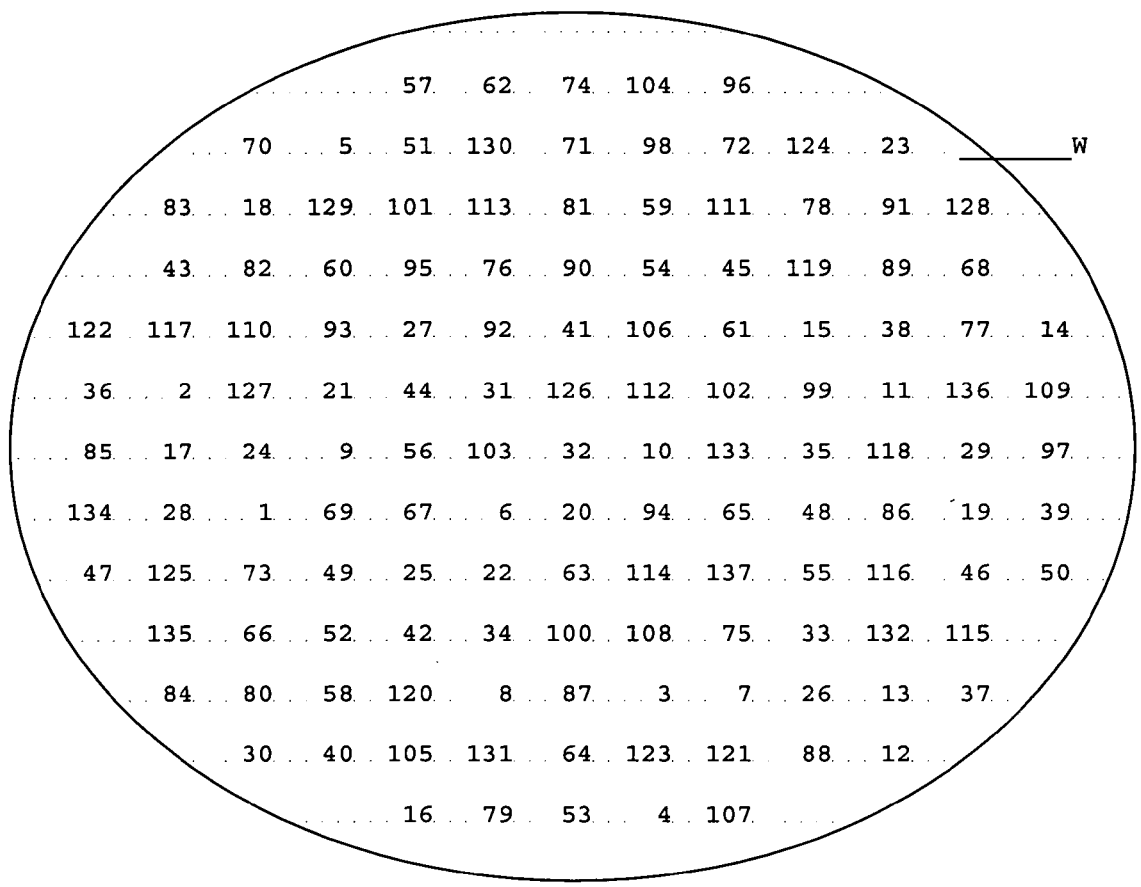
FIG. 4 depicts a top view of an arrangement of patterns with randomly exposed/read out patterns according to an embodiment of the invention.

FIG. 4 shows an embodiment of the substrate in which the patterns are indicated with the successive numerals 1, 2, 3, . . . Each reference numeral indicates the order and thus the moment in time at which the pattern has been exposed and/or read out during the calibration process. As can be seen in the drawing, the patterns are exposed/read out in fully random order. Because of that the drift influences can be corrected for, for example by stitching the measurement results of neighboring patterns with each other.

Figure 5:
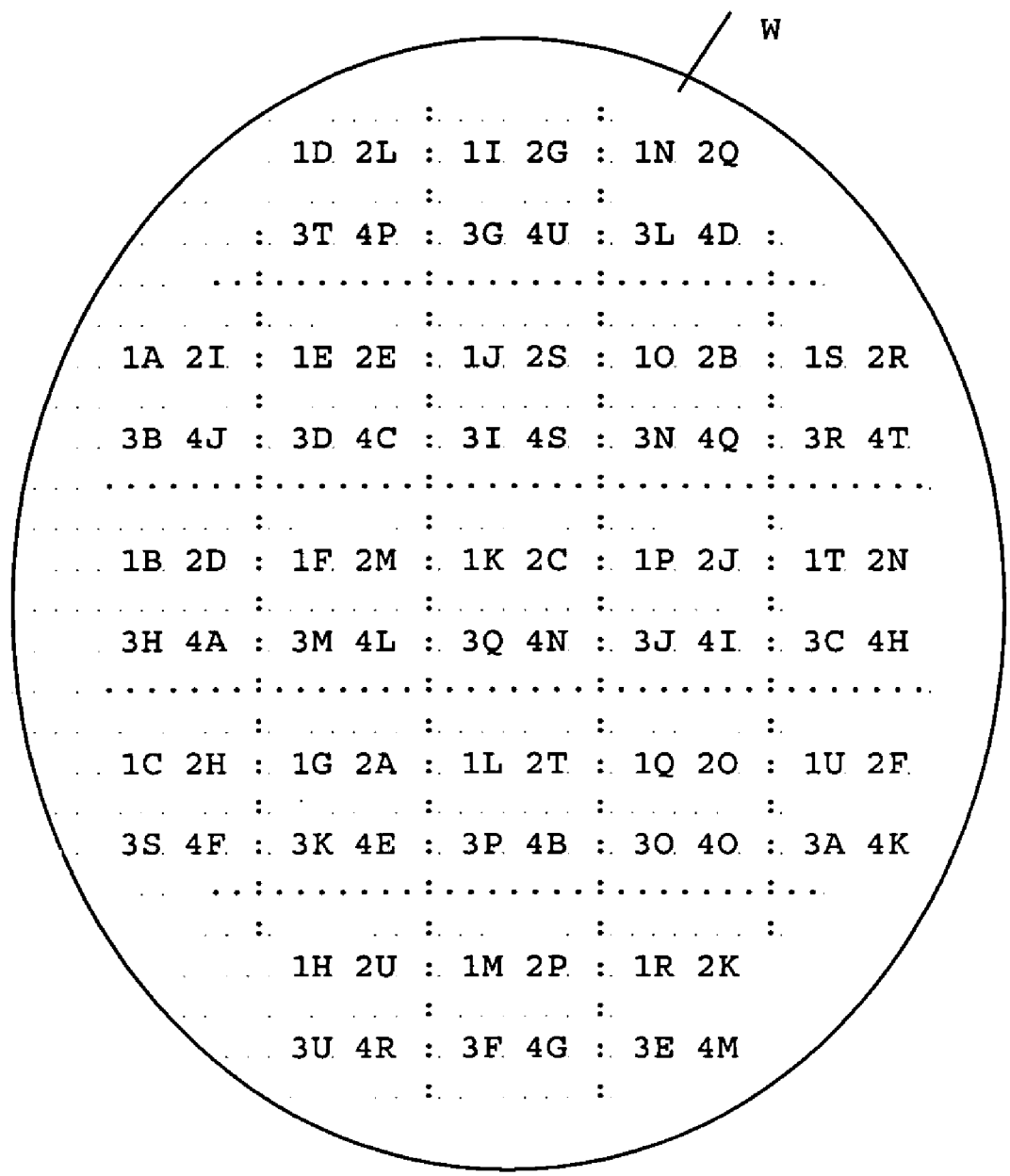
FIG. 5 depicts a top view of an arrangement of patterns with randomly periodically exposed/read out patterns in different areas according to an embodiment of the invention.

FIG. 5 shows an embodiment in which several sets of neighboring patterns are exposed/read out in a corresponding number of different areas onto the surface of the substrate. The areas are indicated with imaginary dotted lines. The exposures/read outs are performed in several periods. During each period the exposures/read outs are done in a semi-random order, such that each area is covered once per period. In the example shown in FIG. 5, the first period is depicted by 1A, 1B, . . . 1U, the second period by 2A, . . . 2U, the third by 3A, . . . , 3U and the fourth by 4A, . . . , 4U. The neighboring patterns of each area can be used to determine the drift influences as a function of the measured positions of the substrate table compared with the pattern read out results for that set of neighboring patterns.

Figure 6:
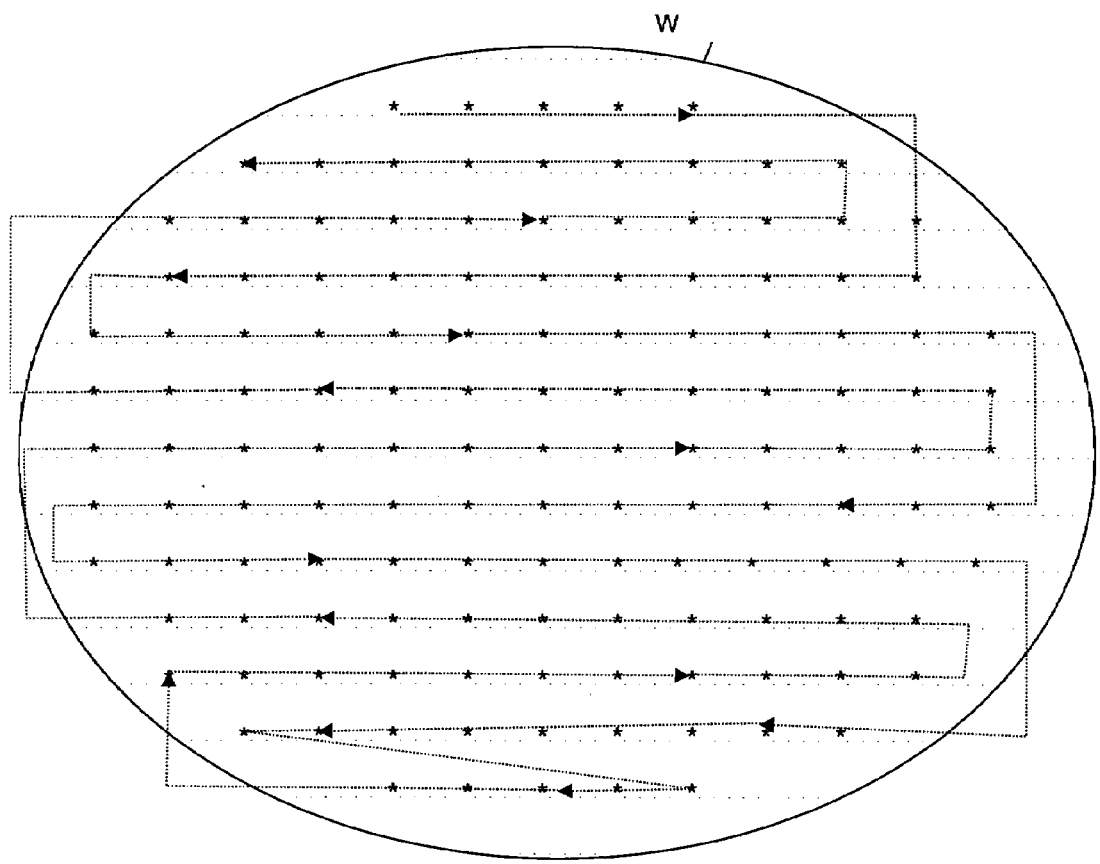
FIG. 6 depicts a top view of an arrangement of patterns with two sets of patterns exposed/read out in opposite orders according to an embodiment of the invention.
Figure 7:
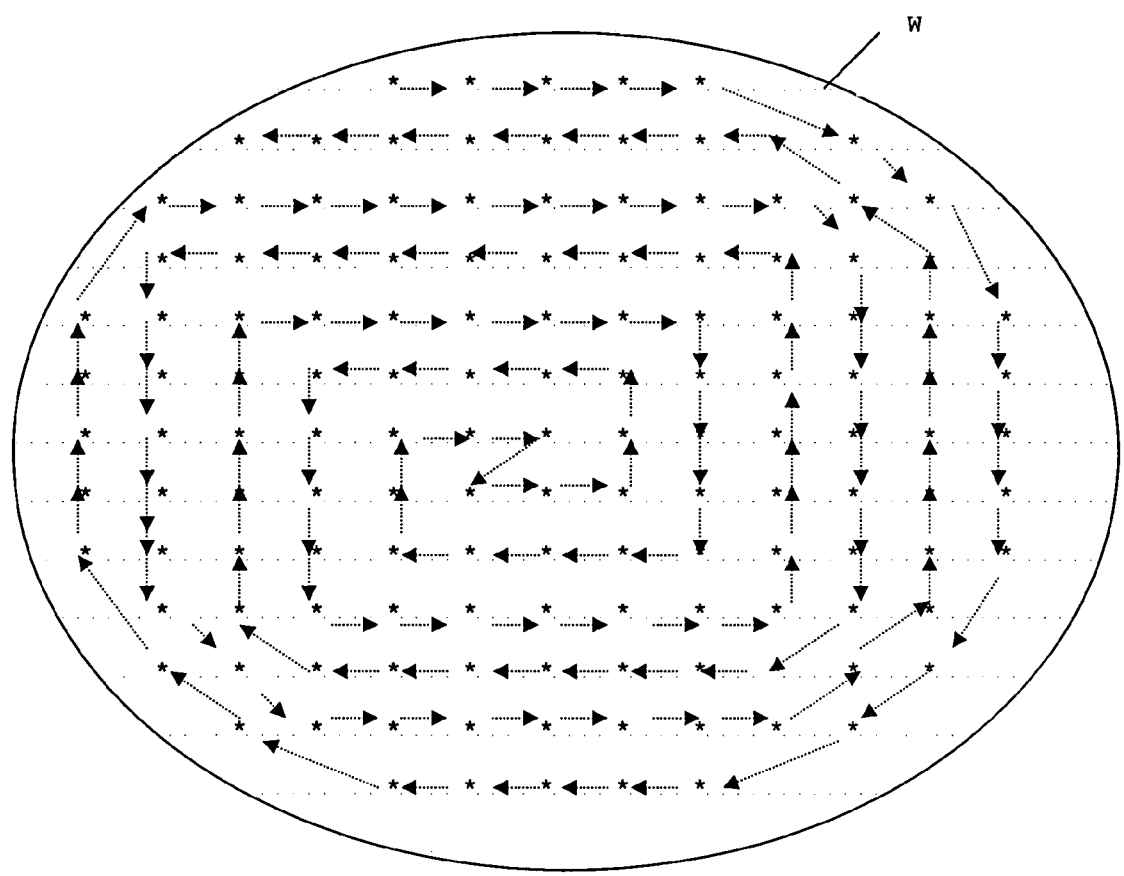
FIG. 7 depicts a top view of an arrangement of patterns with two sets of patterns exposed/read out in opposite orders according to an alternative embodiment of the invention.

FIGS. 6 and 7 show embodiments in which a first set of patterns * is exposed/read out in a forward order, and a second set of patterns * neighboring the first set is exposed/read out in an opposite backward order. This is indicated with arrows. FIG. 6 shows that the two sets of neighboring patterns are exposed/read out in a back and forward meandering layout, whereas FIG. 7 shows that the two sets of neighboring patterns are exposed/read out in a circular back and forward layout. The neighboring sets of patterns * are thus exposed/ read out at different moments in time and can be used to determine and average the drift influences as a function of the measured positions of the substrate table compared with the pattern read out results for the neighboring sets of patterns.

Besides the embodiments shown, it will be appreciated that many variants are possible. For example reading out and exposure of the patterns may be performed in many ways, which are known from the state of the art. Neighboring patterns may or may not overlap each other, i.e. in X direction as well as in Y direction. The above description concentrates on correction of three degrees of freedom, being $dX(X,Y)$, $dY(X,Y)$ and $dRz(X,Y)$. With $dX$, $dY$ and $dRz$ being the local position errors of the positioning system, for example of the positioning sensors thereof. It will be appreciated, however, that a similar approach may be also possible in other directions, for example $dZ(X,Y)$, $dRx(X,Y)$, $dRy(X,Y)$. Instead of repeatedly reading out a reference pattern, it is also possible to repeatedly read out one or more, or even all of the patterns of the two dimensional arrangement at different moments in time, in order to determine the drift influences for those patterns. This repeatedly reading out at least one of the patterns at different moments in time can be performed periodically during the calibration process, and/or performed for all of the patterns at least twice at different moments in time, and/or performed at least twice in different orders, for example in a forward and backward order. The irradiation of the patterns onto the substrate as part of the calibration here, may be performed by making use of a substrate, such as a semi-conductor wafer, which is used for calibration purposes only. Also, it may be the case that the calibration described herein is performed on a substrate on which also other patterns are applied.

It is noted that the calibration as described herein does not calibrate position sensors of the substrate table WT per se (e.g. encoders, interferometers which measure the position of the substrate table WT). However, instead, the calibration as described herein calibrates the positioning of the substrate table as a whole, including the sensors, control system, actuators, etc.

In order to minimize the effects of drift during exposure, a more or less stable situation may be created, i.e. a constant lens temperature can be achieved, for example by performing dummy exposures.

It is also possible to rotate the substrate a multiple of about 90 degrees during the exposure/read out. This way, the X direction can be coupled to the Y direction, and accuracy in one direction can be linked to the other direction. In this way the overall accuracy of the calibration process is improved. Furthermore, in this way non-orthogonality and scaling can be calibrated. When rotating the substrate, differences in substrate table and substrate deformation can be distinguished for the purpose of calibration.

It is also possible to perform the calibration method for a lithographic apparatus having dual chucks each having a substrate table, or even for chucks/substrate tables of different machines.

In the lithographic apparatus, the calibration method may be controlled by a control system configured to derive position errors as a function of the measured positions of the substrate table compared with the pattern read out results, and to calibrate the positioning system using the position errors. Preferably, the control system is further configured to determine drift influences of the positioning system, to use the determined drift influences to correct the position errors as a function of the corresponding two dimensional position of the substrate table, and to use the corrected position errors to calibrate the positioning system. The control system may include one or more inputs to receive signals from the sensors which measure the position of the substrate table, and driving outputs to drive actuators to position the substrate table. Furthermore, the control system may be adapted to drive a positioning of the support for the patterning device and arrange irradiating of the patterns onto the substrate.

The above described calibration method according to an embodiment of the invention may beneficially be accommodated in a software program. This software program may include either the initiation and steering of the loading of a reference substrate on the substrate table, or the initiation and steering of exposing of the two dimensional arrangement of patterns onto the substrate. The software program or computer program includes machine readable instructions to perform a calibration method as discussed previously.

Having performed the calibration as described here, the lithographic apparatus may process a plurality of substrates, making use of the calibration in the two dimensions. Calibration as to intermediate positions, i.e. positions of the substrate table which correspond to a position between such patterns, may be obtained by any suitable interpolation.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A calibration method for calibrating a position of a substrate table in a lithographic apparatus, the method comprising:
   providing a substrate on the substrate table, the substrate including a two dimensional arrangement of patterns on a surface thereof;
   positioning the substrate table with a positioning system;
   measuring positions of the substrate table in at least two dimensions with a position measurement system;
   reading out the arrangement of patterns on the substrate as a function of the measured positions of the substrate table with a pattern read out system to obtain pattern read out results;
   deriving position errors as a function of the measured positions of the substrate table compared with the pattern read out results; and
   calibrating the positioning system using the position errors, the calibrating including determining drift influences of the positioning system, which determined drift influences are used to correct the position errors as a function of the corresponding two dimensional positions of the substrate table, and wherein the corrected position errors are used to calibrate the positioning system.

2. The calibration method according to claim 1, wherein providing a substrate on the substrate table comprises placing a substrate on the substrate table and repeatedly exposing a pattern onto the surface of the substrate so as to create the two dimensional arrangement of patterns on the surface of the substrate, the repeatedly exposing including displacing the substrate table between successive exposures to expose the patterns onto different locations on the surface of the substrate.

3. The calibration method according to claim 2, wherein repeatedly exposing a pattern comprises exposing at least one set of reference patterns at positions close to each other onto the surface of the substrate, wherein respective reference patterns of the respective set are exposed at different moments in time in between exposure of other patterns of the two dimensional arrangement, wherein the reference patterns are used to determine the drift influences as a function of the measured positions of the substrate table compared with the pattern read out results of the reference patterns, and wherein the drift influences determined for the reference patterns are used to correct the position errors for all exposed patterns of the two dimensional arrangement.

4. The calibration method according to claim 3, wherein at least two sets of reference patterns are exposed in respective dedicated areas provided at different positions on the surface of the substrate.

5. The calibration method according to claim 2, wherein repeatedly exposing a pattern comprises exposing at least part of the patterns in a random order,
   wherein the randomly exposed patterns are used to determine the drift influences as a function of the measured positions of the substrate table compared with the pattern read out results of the randomly exposed patterns, and
   wherein the drift influences determined for the randomly exposed patterns are used to correct the position errors for all exposed patterns of the two dimensional arrangement.

6. The calibration method according to claim 5, wherein all of the patterns of the two dimensional arrangement are exposed in a random order.

7. The calibration method according to claim 2, wherein repeatedly exposing a pattern comprises exposing several sets of neighboring patterns in a corresponding number of different areas onto the surface of the substrate,
   wherein a pattern is exposed successively in each area until all the patterns of the two dimensional arrangement are exposed,
   wherein neighboring patterns of a set are used to determine the drift influences as a function of the measured positions of the substrate table compared with the pattern read out results for that set of neighboring patterns, and
   wherein the drift influences determined for the sets of neighboring patterns are used to correct the position errors for all the exposed patterns of the two dimensional arrangement.

8. The calibration method according to claim 7, wherein successively exposing a pattern in each area is repeated in random order with respect to the different areas until all the patterns of the two dimensional arrangement are exposed.

9. The calibration method according to claim 2, wherein repeatedly exposing a pattern comprises exposing at least a first set of patterns in a first order, and a second set of patterns neighboring the first set in a second order which is different from the first order,
   wherein neighboring sets of patterns are used to determine the drift influences as a function of the measured positions of the substrate table compared with the pattern read out results for the neighboring sets of patterns, and
   wherein the drift influences determined for the neighboring sets of patterns are used to correct the position errors for all exposed patterns of the two dimensional arrangement.

10. The calibration method according to claim 9, wherein the exposing of the first set of patterns is performed in a forward order, and the reading out of the second set of patterns neighboring the first set is performed in a backward order which is opposite to the forward order.

11. The calibration method according to claim 1, wherein providing a substrate on the substrate table comprises placing a reference substrate on the substrate table, the reference substrate already provided with a two dimensional arrangement of patterns on the surface thereof.

12. The calibration method according to claim 1, wherein reading out the arrangement of patterns on the substrate as a function of the measured positions of the substrate table comprises repeatedly reading out at least one of the patterns at different moments in time so as to determine the drift influences for that pattern.

13. The calibration method according to claim 12, wherein repeatedly reading out at least one of the patterns at different moments in time is performed periodically during calibration.

14. The calibration method according to claim 12, wherein all of the patterns are read out at least twice at different moments in time.

15. The calibration method according to claim 12, wherein repeatedly reading out patterns includes reading out the patterns at least twice in different orders.

16. The calibration method according to claim 15, wherein repeatedly reading out patterns includes reading out in a forward and backward order.

17. The calibration method according to claim 1, wherein reading out a pattern comprises reading out at least one set of reference patterns at positions close to each other onto the surface of the substrate,
wherein respective reference patterns of the respective set are read out at different moments in time in between the reading out of other patterns of the two dimensional arrangement,
wherein the reference patterns are used to determine the drift influences as a function of the measured positions of the substrate table compared with the pattern read out results of the reference patterns, and
wherein the drift influences determined for the reference patterns are used to correct the position errors for all read out patterns of the two dimensional arrangement.

18. The calibration method according to claim 17, wherein at least two sets of reference patterns are read out in respective dedicated areas provided at different positions on the surface of the substrate.

19. The calibration method according to claim 1, wherein reading out a pattern comprises reading out at least part of the patterns in a random order,
wherein the randomly read out patterns are used to determine the drift influences as a function of the measured positions of the substrate table compared with the pattern read out results of the randomly read out patterns, and
wherein the drift influences determined for the randomly read out patterns are used to correct the position errors for all read out patterns of the two dimensional arrangement.

20. The calibration method according to claim 19, wherein all of the patterns of the two dimensional arrangement are read out in a random order.

21. The calibration method according to claim 1, wherein reading out a pattern comprises reading out several sets of neighboring patterns in a corresponding number of different areas onto the surface of the substrate,
wherein a pattern is read out successively in each area until all patterns of the two dimensional arrangement are read out,
wherein neighboring patterns of a set are used to determine the drift influences as a function of the measured positions of the substrate table compared with the pattern read out results for that set of neighboring patterns, and
wherein the drift influences determined for the sets of neighboring patterns are used to correct the position errors for all read out patterns of the two dimensional arrangement.

22. The calibration method according to claim 21, wherein successively reading out a pattern in each area is repeated in random order with respect to the different areas until all patterns of the two dimensional arrangement are read out.

23. The calibration method according to claim 1, wherein reading out a pattern comprises reading out at least a first set of patterns in a first order and a second set of patterns neighboring the first set in a second order which is different from the first order,
wherein neighboring sets of patterns are used to determine the drift influences as a function of the measured positions of the substrate table compared with the pattern read out results for the neighboring sets of patterns, and
wherein the drift influences determined for the neighboring sets of patterns are used to correct the position errors for all the read out patterns of the two dimensional arrangement.

24. The calibration method according to claim 23, wherein the reading out of the first set of patterns is performed in a forward order, and the reading out of the second set of patterns neighboring the first set is performed in a backward order which is opposite to the forward order.

25. The calibration method according to claim 1, wherein the substrate is rotated at least once during exposure and/or reading out of the patterns, over an angle of about 90 degrees.

26. The calibration method according to claim 1, wherein the position measurement system forms part of the positioning system.

27. The calibration method according to claim 1, wherein the pattern read out system forms part of the positioning system.

28. A lithographic apparatus comprising:
an illumination system configured to condition a radiation beam;
a support constructed to support a patterning device, the patterning device configured to impart the radiation beam with a pattern in its cross-section to form a patterned radiation beam;
a substrate table constructed to hold a substrate;
a projection system configured to project the patterned radiation beam onto a target portion of the substrate; and
a positioning system configured to position the substrate table, the positioning system including
a measurement system configured to measure positions of the substrate table in at least two dimensions,
a pattern read out system configured to read out a two dimensional arrangement of patterns on a substrate held on the substrate table as a function of the measured positions of the substrate table to obtain pattern read out results, and
a control system configured to
derive position errors as a function of the measured positions of the substrate table compared with the pattern read out results,
determine drift influences of the positioning system,
correct the position errors as a function of the corresponding two dimensional position of the substrate table based on the determined drift influences, and
calibrate the positioning system based on the corrected position errors.

29. A computer product comprising machine readable instructions configured, when loaded into a control system of a lithographic apparatus, to have the lithographic apparatus perform a calibration method for calibrating a position of a substrate table, the method comprising:
providing a substrate on the substrate table, the substrate including a two dimensional arrangement of patterns on a surface thereof;
positioning the substrate table with a positioning system;
measuring positions of the substrate table in at least two dimensions with a position measurement system;
reading out the arrangement of patterns on the substrate as a function of the measured positions of the substrate table with a pattern read out system to obtain pattern read out results;

deriving position errors as a function of the measured positions of the substrate table compared with the pattern read out results; and calibrating the positioning system using the position errors, the calibrating including determining drift influences of the positioning system, which determined drift influences are used to correct the position errors as a function of the corresponding two dimensional positions of the substrate table, and wherein the corrected position errors are used to calibrate the positioning system.

30. The computer product according to claim 29, wherein the position measurement system forms part of the positioning system.

31. The computer product according to claim 29, wherein the pattern read out system forms part of the positioning system.

* * * * *